Aug. 9, 1960 R. H. POSTAL 2,948,837

SOLID STATE ELECTRONIC SWITCH AND CIRCUITS THEREFOR

Filed Sept. 4, 1956

INVENTOR
Robert H. Postal
BY George H. Fritzinger
Agt.

2,948,837

SOLID STATE ELECTRONIC SWITCH AND CIRCUITS THEREFOR

Robert H. Postal, Clifton, N.J., assignor, by mesne assignments, to McGraw-Edison Company, Elgin, Ill., a corporation of Delaware Filed Sept. 4, 1956, Ser. No. 607,861

6 Claims. (Cl. 317—238)

This invention relates to a solid-state electronic switch and to control and utilization circuits therefor.

An object of my invention is to provide a novel electronic switch having no moving parts.

Another object is to provide a solid-state electronic switch which can be selectively transformed into conductive and non-conductive states respectively by the voltage and current conditions imposed on the switch.

A further object is to provide a solid-state electronic switch having novel operating characteristics and to provide novel utilization circuits for such a switch.

These and other objects and features of my invention will be apparent from the following description and the appended claims.

Figure 1:
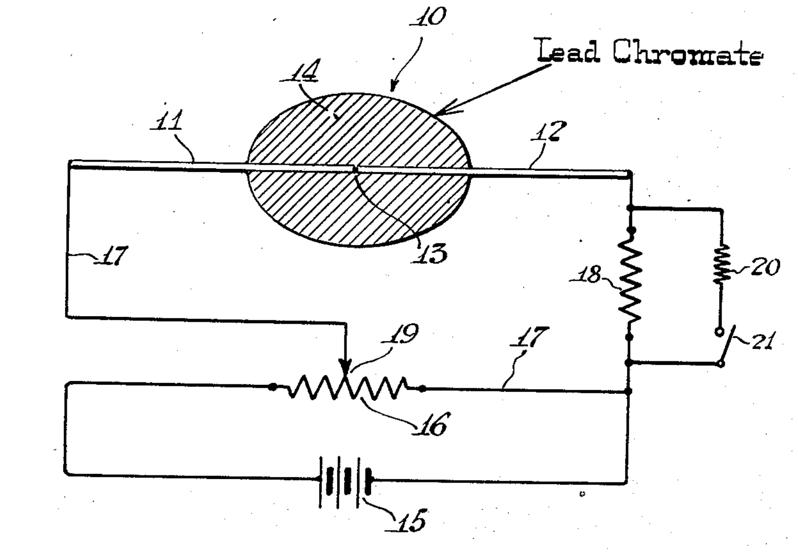
Figure 2:
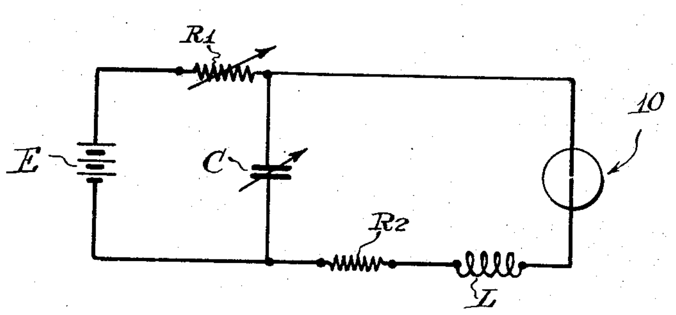

In the description of my invention reference is had to the accompanying drawings, of which:

Figure 1 is a sectional view of a solid state electronic switch according to my invention together with a control circuit therefor; and Fig. 2 is a schematic circuit diagram of a relaxation oscillator circuit employing my electronic switch.

The present electronic switch 10 comprises two electrodes 11 and 12 having adjacent portions contiguous to each other at 13, preferably portions in butt-joint relation, and a body 14 of a semiconductive material fuzed onto the adjacent portions of the two electrodes with formation of a film of the semiconductive material between the abutted surfaces. Preferably, as shown in Figure 1, the electrodes may be in the form of two fine wires in end-butt relation, and the semiconductor may be in the form of a small bead fuzed onto the wires across the butt joint. When such semiconductive material is fuzed onto the wires a film thereof flows across the end surfaces to effect a minute separation between the wires. The provision of such film of semiconductive material between the ends of the wires is belived to be important to the invention.

The need for fuzing the semiconductive material onto the electrodes as above described, imposes limitations on the electrodes and semiconductive materials with respect to their relative melting temperatures. For example, it is important that the semiconductive material have a melting temperature substantially below that of the electrodes. To meet this requirement, I preferably use electrodes made of platinum wire—which may be of the order of .002″ in diameter—and use a semiconductive material having a fuzing temperature not in excess of about 1300° C., suitable semiconductive materials in this range being lead chromate having a fuzing temperature of about 844° C., copper oxide having a fuzing temperature of about 1230° C., or lead oxide having a fuzing temperature of about 888° C. Such fuzed semi-conductive material forms a strong physical bond with the wires and has sufficient strength to hold the wires positively in fixed relation to each other. The foregoing examples of semiconductive materials are illustrative and not necessarily limitative of the invention since it is believed that the general class of semiconductive materials useful for the purposes of the present invention are those of the oxidic type, as is hereinafter more fully described.

The present switch device is inherently in the non-conductive state having a resistance of the order of $10^8$ ohms. However, when the voltage across the wires is raised to a critical value of the order of 22 volts, the device is instantly transformed into the conductive state having a resistance of only about 10 ohms. In order to limit the current flow through the device to a few microamperes when the device is transformed into the conductive state, the critical voltage is applied across the device through a high resistance, for example a resistance of the order of 4.4 megohms. The device will remain indefinitely in this conductive state and will pass current up to about 30 milliamperes, representing about a .3 volt drop thereacross. However, if the current through the device is increased still further to a critical value of the order of 35 milliamperes, the device will instantly revert back to its non-conducting state until it is again rendered conductive by application of the critical voltage of about 22 volts. Alternatively, the device can be rendered non-conductive by heating it to a critical temperature of the order of 250° F. as by heat from an external source.

It is believed the transformation of the switch device from the non-conductive to the conducting state occurs by reason of the intense electric field which is provided across the thin film of semiconductive material between the end faces of the two wire electrodes. It is well known that relatively pure elemental semiconductive materials such as germanium and silicon are subject to electrical breakdown under influence of high field concentrations and radiation effects, but that the breakdown resulting in the conductive state is instable, lasting of the order of only a few minutes. With the materials and construction herein disclosed the electrical breakdown giving rise to the conductive state appears however to be permanently stable. This permanent stability is attributed to the use of oxidic semiconductors instead of the use of the elemental semiconductive materials such as germanium and silicon. An explanation for the stability achieved with the use of oxidic semiconductors is that these materials have metallic ions which are reducible to metal to provide a low-resistance path across the wires under the influence of high field concentration. This low-resistance path is however broken down into the high-resistance state to restore the switch to the insulative condition under influence of high current density or high temperature. This transformation of the present switch device between its conductive and non-conductive states can be repeated without limitation and without destroying the stability of the switch in either of its two states so long as the device is not subjected to the critical field and current conditions above explained.

Another manner of explaining the operation of the present switch device, which may be advanced, is that the high electrical field across the film between the two electrodes increases the concentration of mobile electrons or holes as a result of impact ionization by free carriers accelerated to the necessary velocity by the applied field. This concentration of mobile electrons forms so-called traps—which are crystal formations immobilizing minority carriers and holding them in an unrecombined state. On removal of the high electric field the carriers fall back into states of unexcited energy but remain captured in the traps. Associated with such trapped carriers is an augmented concentration of carriers of the opposite sign which mobilize the space charge of the trapped minority carriers and increase the conductivity of the semiconductive material. However, by the application of thermal energy to a critical value either from an external thermal source or by electric current heating, it is possible to ionize and destroy the traps and thus restore the semiconductor to a state of non-conductivity. It is to be understood however that no unnecessary limitation on the invention is intended by the explanation here advanced.

The circuit shown in Figure 1 illustrates one way of transforming the electronic switch 10 from a non-conductive to a conductive state, and vice versa. This circuit comprises for example, a D.C. source 15 of about 30 volts connected across a potentiometer 16, and a circuit 17 leading from one end of the potentiometer through a resistor 18 and the switch 10 to a movable contact 19 through the potentiometer. As aforestated, the resistor 18 may have a resistance of about 4.4 megohms, but wide variation in this resistance is permitted as will be understood. Connected across the resistor 18 is a shunt circuit including a resistor 20 having a relatively low resistance of the order of 650 ohms and a shorting switch 21.

Starting with the electronic switch 10 in this non-conductive state, the shorting switch 21 open and the contact 19 near the low potential side of the potentiometer, the electronic switch 10 will become conductive when the contact 19 is shifted upwardly to impress about 23 volts on the circuit 17. As the electronic switch breaks down a current of about 5.2 microamperes flows in the circuit 17 responsive to the 23 volts acting through the 4.4 megohms resistor. The electronic switch is now in a stable conductive state and will remain so until a current is passed therethrough in excess of about 35 milliamperes. The current through the switch may be varied for utilization purposes by varying the source 15, the potentiometer 16 and/or the resistor 18; still further, the switch may be shifted into any other suitable utilization circuit not shown.

To convert the switch 10 back to the non-conductive state with the circuit shown in Figure 1, it is only necessary to close the shorting switch 21 to connect the voltage supply from the potentiometer across the switch 10 through only the resistor 20. The setting of the potentiometer for effecting this transformation depends upon the value of the shorting resistor 20. If the setting is the same as that which provided the transformation to the conductive state—i.e., that providing about 23 volts in the circuit 17—the resistor 20 may be of the order of 650 ohms as aforementioned.

The transformation to the non-conductive state is believed to be due to the heating effect of the relatively large current which flows through the electronic switch under the aforestated conditions. Upon reopening the shorting switch 21 and leaving the potentiometer at its 23 volt setting, the electronic switch will be converted back to its conductive state as soon as the switch is cooled substantially from its prior heated condition.

In Figure 2 there is shown a relaxation oscillator circuit employing my novel electronic switch 10. In this circuit the condenser C is charged through the resistor $R_1$ by the battery E until the critical voltage is obtained across the switch 10. Thereupon the switch 10 is converted into its conductive state. The inductance L retards the rise of current through the switch 10 from discharge of the condenser C until such time as the current reaches its critical value to convert the electronic switch back to its non-conductive state. Thereupon, the condenser C is recharged through the resistor $R_1$ by the battery E to start a second cycle as aforestated.

The embodiment of electronic switch herein particularly shown and described as well as the particular uses thereof are intended to be illustrative and not limitative since the same is subject to changes and modifications without departure from the scope of my invention which I endeavor to express according to the following claims.

I claim:

1. A solid-state electronic switch capable of being transformed between conductive and non-conductive states comprising two pointed electrodes of like metals having adjacent terminal portions with surfaces in close proximity to each other, and a body of an oxidic, semiconductive material bonded onto said electrodes across said adjacent portions thereof with interposition of a continuous film of the semiconductive material between said surfaces and in direct contact therewith.

2. A solid-state electronic switch alternatively conditionable into conductive and insulative states, comprising two metal wires of the same material in close end-butt relation, and a body of an oxidic, semiconductive material fused directly onto the adjacent end portions of said wires across the butt joint thereof.

3. An electronic switch as set forth in claim 1 wherein the semiconductive material has a melting point substantially below that of the electrodes to permit the semiconductive material to be fused onto the electrodes with flow of a film of the semiconductive material between said surfaces.

4. A solid-state electronic switch as set forth in claim 3 wherein said semiconductive material is lead chromate and said electrodes are made of platinum.

5. A solid-state electronic switch as set forth in claim 1 wherein said semiconductive material is selected from the group consisting of copper oxide, lead chromate and lead oxide.

6. A solid-state electronic switch as set forth in claim 1 wherein said electrodes are metal wires in end-butt relation and the diameter of the wires is of the order of .002", and wherein the semiconductive material is fused onto the wires with flow of a thin film of the material between the end faces of the wires.

References Cited in the file of this patent

UNITED STATES PATENTS

| | | |
|---|---|---|
| 1,678,825 | Ruben | July 31, 1928 |
| 1,751,460 | Ruben | Mar. 18, 1930 |
| 2,541,832 | Quinn | Feb. 13, 1951 |
| 2,711,496 | Ruben | June 21, 1955 |
| 2,887,632 | Dalton | May 19, 1959 |

FOREIGN PATENTS

| | | |
|---|---|---|
| 669,611 | Great Britain | Apr. 2, 1952 |
| 165,098 | Australia | Sept. 8, 1955 |